United States Patent [19]

Beling

[11] Patent Number: 4,859,925
[45] Date of Patent: Aug. 22, 1989

[54] POWER TRANSMISSION SYSTEMS AND MEANS FOR CONTROL THEREOF

[75] Inventor: Thomas E. Beling, Saxonville, Mass.

[73] Assignee: Sigma Instruments, Inc., Weymouth, Mass.

[21] Appl. No.: 944,709

[22] Filed: Dec. 19, 1986

Related U.S. Application Data

[63] Continuation-in-part of Ser. No. 776,910, Sep. 17, 1985, Pat. No. 4,700,123.

[51] Int. Cl.$^4$ .............................................. G05F 1/70
[52] U.S. Cl. ..................................... 323/210; 324/96; 174/139
[58] Field of Search .......................... 323/205, 208–211; 324/96, 97, 126, 127; 174/139

[56] References Cited

U.S. PATENT DOCUMENTS

| | | |
|---|---|---|
| 3,363,174 | 1/1968 | Hudson et al. ........................ 174/139 |
| 3,485,940 | 12/1969 | Perry et al. .......................... 174/139 |
| 4,356,441 | 10/1982 | Putman et al. ....................... 323/210 |
| 4,578,639 | 3/1986 | Miller .................................... 324/96 |
| 4,637,072 | 1/1987 | Hellström ............................. 324/96 |

Primary Examiner—Peter S. Wong
Attorney, Agent, or Firm—Leo Stanger

[57] ABSTRACT

In a power distribution system, in order to maximize efficiency and to provide protection in the event of a lightning strike or other transient, a fiber optic drive is utilized to transmit measured parameter signals through a fiber optic link to a control system. The fiber optic drive is powered only in timed, short bursts at ten second to ten minute intervals with a power supply that capacitively draws small amounts of energy over the long intervals and energizes the drive with accumulated high power pulses.

37 Claims, 5 Drawing Sheets

POWER TRANSMISSION SYSTEMS AND MEANS FOR CONTROL THEREOF

RELATED APPLICATIONS

This is a continuation in part of U.S. application Ser. No. 776,910, filed Sept. 17, 1985 of Thomas E. Beling for Power Distributions Systems and Means For Control Thereof, now U.S. Pat. No. 4,700,123.

BACKGROUND OF THE INVENTION

This invention relates to power distribution systems, and particularly to arrangements for measuring parameters of power lines and for using the measurements to control the conditions of the lines.

To maximize efficiency of energy use, and meet growing demands, utilities must automatically adjust their power transmission by detecting conditions as they happen. This involves simultaneous measurement of currents and voltages so that phase conditions can be determined, and using the results for control of the system. Methods and means of measurement are shown in U.S. Pat. Nos. 3,363,174 and 3,386,059, as well as in the aforementioned U.S. Pat. application.

The arrangements described in the above patents are inadequate for growing future demands. The aforementioned application includes an arrangement for measuring fundamental parameters such as voltage, current, and phase of electric power distribution or transmission lines in an economical manner. However, the signal conditioning equipment of the system is connected conductively to the transmission line ground. In the event of a lightning strike or other transient, the transmission line ground can be temporarily elevated thousands of volts. This may result in burn out of the signal ground or the signal conditioning equipment.

THE INVENTION

An object of this invention is to improve power transmission systems and means for control thereof.

Another object of this invention is to avoid the aforementioned deficiencies.

Yet another object of this invention is to improve arrangements for measuring distribution line parameters and transmitting the measured values.

Yet another object of the invention is to improve signal conditioning electronics of a measuring system in a power distribution network.

According to a feature of the invention these objects are attained in whole or in part, by passing measured parameter signals to a fiber optic drive which transmits the signals through a fiber optic link to a control system, and powering the fiber optic drive only in timed short bursts at ten second to ten minute intervals with a power supply that capacitively draws small amounts of energy over the long intervals and energizes the drive with accumulated high power pulses.

According to another feature of the invention, the power transmission system includes a power line, means for coupling to the power line, current measuring means connected to the coupling means, voltage forming means connected to the coupling means, signal forming means connected to the current measure means and voltage forming means for producing transmissible parameter signal, optical fiber means coupled to the signal forming means, control means responsive to the optical fiber means for controlling the electrical conditions of the line, and timer means for intermittently energizing the signal forming means.

These and other features of the invention are pointed out in the claims. Other objects and advantages of the invention will become evident from the following detailed description when read in light of the accompanying drawings.

These and other features of the invention are pointed out in the claims. Other objects and advantages of the invention will become evident from the following detailed description when read in light of the accompanying drawings.

DESCRIPTION OF PREFERRED EMBODIMENTS

Figure 1:
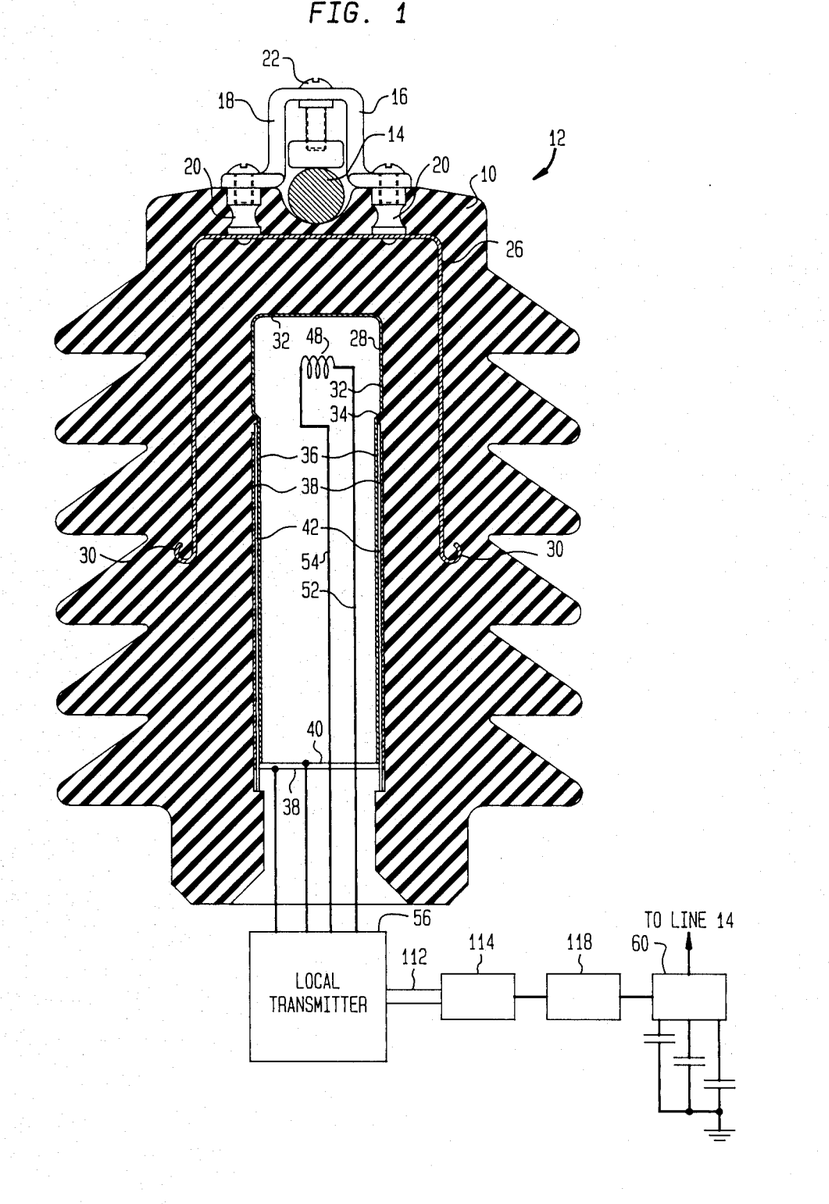
FIG. 1 is a sectional schematic view of a system embodying the invention.
Figure 2:
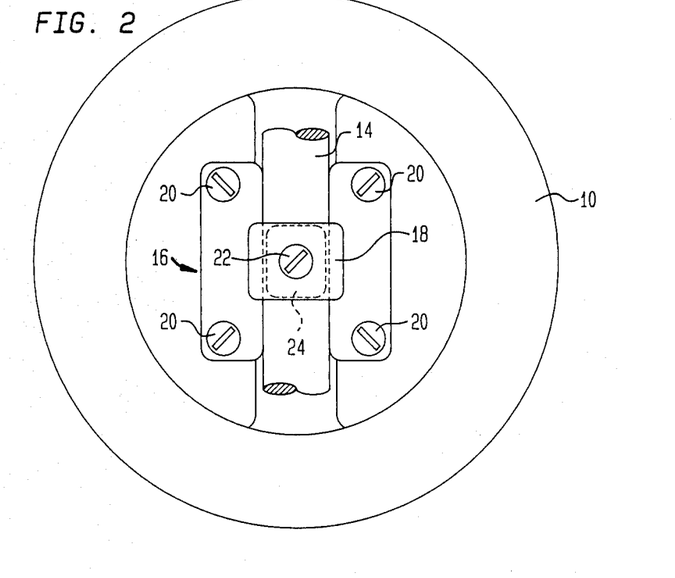
FIG. 2 is a top view of an insulator in FIG. 1.

In FIGS. 1 and 2, an insulating support 10 serves as the housing of an electrical coupling device 12 coupled to a power line 14 of one phase of a three-phase power distribution system. The electrical coupling device 12 permits metering, relaying, phase control or other control operations of the system in accordance with the current and voltage and their respective phases of the line 14 with respect to ground. On the support 10, a securing arrangement 16 composed of a conductive metal cap 18, connectors 20, a bolt 22, and a contactor 24 that contacts the line 14 and connects it to a cylindrical high-voltage electrode 26 embedded in the support 10. The support 10 is composed of an insulating or dielectric material. According to one embodiment of the invention, the material constituting the support is Polysil, which is composed of 90% silicon dioxide, plastic, MMA, and Lucite polyester. According to another embodiment the material constituting the support 10 is a resin, preferably a cycloaliphatic resin with aluminum trihydrate or silicon dioxide filler. The electrode 26 is in the form of a screen of nonferrous metal such as copper or aluminum, which does not interfere significantly with magnetic fields varying at power frequencies such as 50 Hz or 60 Hz.

Mounted in the interior of the support 10 is a cylindrical shielding electrode 28 extending downward below the lower curled up skirt 30 of the electrode 26. The shielding electrode 28 forms an upper cup 32 of one diameter and then narrows at a neck 34 to form a narrower tube 36. Surrounding the tube 36 along its length is a cylindrical ground electrode 38 that extends below the shielding electrode 28 to form a spark gap 40. A preformed cylindrical sleeve 42 of the same insulating material as the support 10 separates the tube 36 from the ground electrode 38 and holds the tube 36 within the support 10. The ground electrode is, according to an embodiment, in the form of a mesh screen. According to another embodiment it is a sheet of metal.

Within the cup 32 a coil 48 is wound around an axis such that is senses the varying magnetic field formed by the current through the line 14, and hence the alternating current through the line. Suitable conductors 52 and 54 bring the current in the sensor 48 out of the coupling device 12. Two conductors 58 and 56 carry the voltage between the shielding electrode 28 and the ground electrode 38 out of the housing 10 of the electrical coupling device 12.

Figure 3:
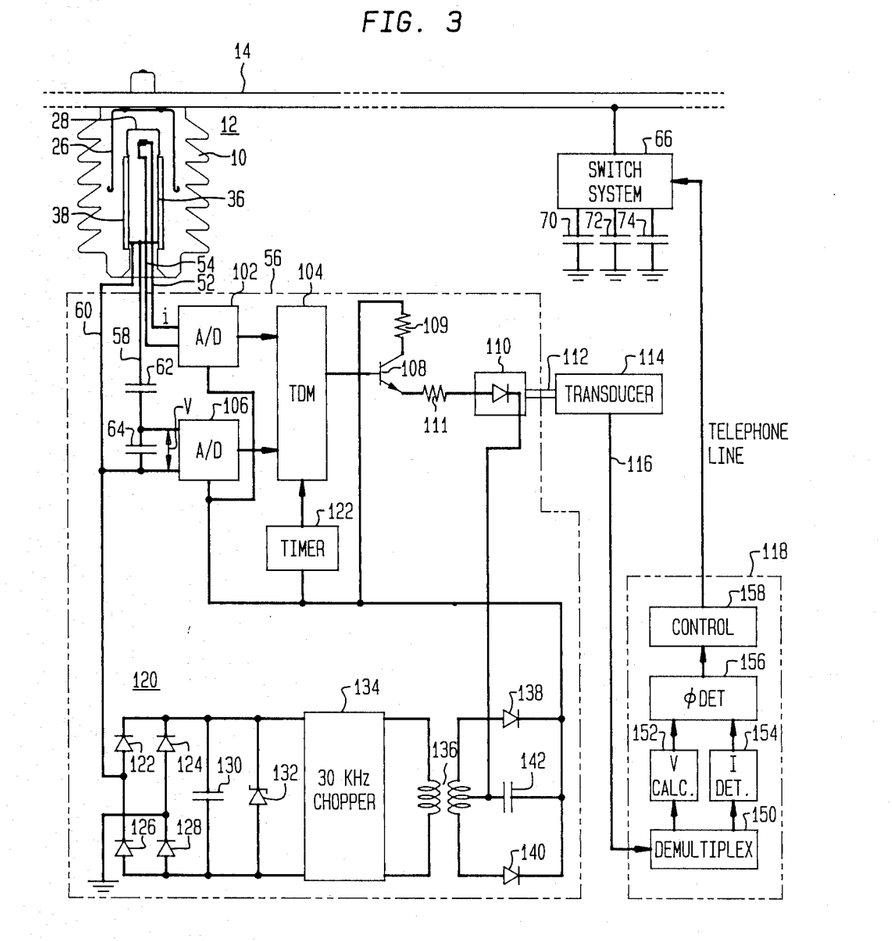
FIG. 3 is a schematic view showing further details of the system in FIG. 1.

FIG. 3 illustrates a system embodying the invention and including the electrical coupling device 12. Here, the conductors 52 and 54 bring the current in the sensor 48 to a local transmitter 56. The two conductors 58 and 60 connect the shielding electrode 28 and the ground electrode 38 across a capacitive voltage divider composed of a 40 pf (picofarad) capacitor 62 and a 4,000 pf capacitor 64 within the local transmitter 56. An analog-to-digital converter 102 converts the current sensed by the sensor 48 to digital form and passes it to a time division multiplexer (TDM) 104. Similarly, an analog-to-digital converter 106 converts the voltage appearing across the capacitor 64 to digital form and applies the resulting pulses to the time division multiplexer 104. The latter time division multiplexes the pulse representing the digital current values and voltage values from the converters 102 and 106, and applies the resulting pulse output to an emitter-follower-connected transistor 108 with a collector resistor 109. Transistor 108 responds by pulse modulating a laser 110 through a resistor 111. The laser 110 produces correspondingly modulated optical pulse signals and transmits them down an optical fiber 112. An optical transducer 114, at the end of the optical fiber 112, converts the optical pulse signals to electrical pulse signals and applies them to a telephone line 116 which further transmits the pulse signals to signal conditioning equipment 118 either at a power station or at a power control station.

The conditioning equipment 18 calculates and indicates the voltage v at the capacitor 64 as well as the voltage VL from line 14 to ground, the current i in conductors 52 and 54, compares the current i and the voltage VL to determine the phase, and controls a switch system 66 that successively adds or subtracts capacitors 70, 72, 74, etc. from the line 14 to ground.

For performing its purposes, the conditioning equipment includes a demultiplexer 150, a voltage calculating circuit 152 to determine and display the voltages v and VL (the latter from line 14 to ground), a current determining circuit 154 to determine and display the current in the line 14, a phase detector 156 to determine and display the phase from voltage VL and current i, and a controller 158 to control the switch system 66.

A present supply 120 furnishes the power for the analog-to-digital converters 102 and 106 as well as the time division multiplexer 104, the laser 110, and a timer 122. The power supply 120 utilizes the capacitive current flow from the line 14 and the shield 26 through the electrode 28 and the electrode 38 to ground. A rectifier bridge composed of diode 122, 124, 126, and 128 intervenes in the line 60 between the electrode 38 and ground, rectifiers the current sensed, and stores it across a smoothing capacitor 130. A Zener diode 132 regulates the voltage across the capacitor 130. A 30 kilohertz (kHz) chopper 134 chops the regulated voltage at 30 kHz and an isolating step-down transformer 136 passes the resulting voltage to a full-wave rectifier composed of diodes 138 and 140. A power capacitor 142 stores the voltage from the full-wave rectifier. The voltage across the capacitor 142 constitutes the voltage output of the power supply 120. That output is applied to the analog-to-digital converters 102 and 106, the time division multiplexer 104, the timer 122, and also to the laser 110, through the transistor 108 and resistor 111.

The amount of energy conveniently available at the capacitor 142 is not enough to sustain continuous operation of a fiber optic link composed of laser 110 and fiber 112. The timer 112 resolves the problem by disconnecting the laser 110 as well as the converter 102 and 106 and the multiplexer 104 from the supply 120 for a sufficiently long time to allow charging of the capacitor 142. The timer 122 then allows the laser 110 to receive a sample burst of signals from the TDM 104 and to send this burst of signals through the optical fiber 112 at ten second to ten minute intervals. The signal burst may for example last eight to one hundred miliseconds, sufficiently long to permit the central control or conditioning equipment 118 to measure and indicate the voltage v at the capacitor 64 the voltage VL at the line 14, and the current i in sensor 48, and compare the current i and VL to determine the phase.

In operation the line 14 carries a high voltage such as 20,000 volts at 50 Hz or 60 Hz. The current through the line forms a sinusoidally varying circular magnetic field about the line. This field induces currents in the sensor coil 48 proportional to the current through the line 14. The resulting current, or voltage across the coil 48, appears at the control arrangement 56.

Neither the shielding electrode 28 nor the electrode 26 impedes the circular magnetic field about the line 14 because the metals of which they are made, e.g. copper or aluminum, do not significantly affect 50 Hz or 60 Hz magnetic fields. Hence the magnetic fields are freely sensed by the coil 48.

At the same time the electrode 26, because it is connected to the line 14 by the arrangement 16, forms a capacitive voltage divider with the shielding electrode 28 and the ground electrode 38. That is, the electrode 28 forms one series capacitor of about 26 pf with the electrode 26 and another series capacitor of about 780 pf with the ground electrode 38. The output voltage is taken across the electrode 28 and the ground electrode 38. This capacitive voltage divider divides the 20,000 volts RMS from line to ground by 30. The divider output at line 58 is thus 666 volts RMS. The 40 pf and 4,000 pf capacitors 62 and 64 further divide this voltage by 100 to 6.66 volts.

The local transmitter 56 now sends signals corresponding to the voltage and current sensed down an optical fiber 112 where a transducer 114 and a telephone line 116 apply the signal to the conditioning equipment 118. The control arrangement now switches the capacitors 70, 72, 74, etc. to vary the phase of the voltage to current. It can also send additional signals to allow other adjustments.

In the transmitter 56, the A-to-D (analog-to-digital) converter 102 takes the current from the sensor 48 and converts it to pulse representing digital values. The analog-to-digital converter 106 takes the voltage across electrodes 28 and 38, which has been further voltate-divided by the capacitors 62 and 64, and converts it to pulses representing digital values. The time division multiplexer 104 time division multiplexes the digital current value and the digital voltage value and applies the multiplexed pulses through transistor 108 and resistor 110 to the laser 110 which utilizes the output of the time division multiplexer for approximately eight to one hundred milliseconds within a ten second to ten minute time period or interval established by the timer 122. The resulting bursts of optical pulse signals from the laser 110 pass down the optical fiber to the transducer 114. The telephone line 116 carries the signals to the conditioning equipment 118.

The conditioning equipment 118 now demultiplexes the signal pulses from the transducer 114 with the demultiplexer 150, determines and displays the voltage v and VL with the voltage calculating circuit 152, determines and displays the current i with the current determining circuit 154, calculates and displays the phase from the outputs of the voltage calculating circuit 152 and current determining circuit 154 with the phase detector 156, and transmits control signals to the switching circuit 66 with the controller 158.

The power supply 120 senses the very low capacitive current flowing from the line 14 to ground through the electrodes 26 and 38. The bridge composed of diodes 122 to 128 rectifies the current and applies it across a smoothing capacitor 130. The voltage across the capacitor 130 is regulated by the zener diode 132 and is applied to the 30 kHz chopper 134 whose output is isolated by a transformer 136. A full-wave rectifier composed of diodes 138 and 140 applies its output across the power capacitor 142.

The capacitor formed by the electrodes 26 and 28 and the capacitor formed by electrodes 28 and 38 have dielectrics made of the same material. If the material is Polysil it has a temperature coefficient of capacitance of plus or minus 5% to 7% per 100 degrees centigrade. Because both capacitor dielectrics are made of the same material they compensate for any changes in capacitance and hence in the measurement of voltage.

If the dielectric material of the support 10 and the sleeve 42 is a resin, in particular a cycloaliphatic resin with aluminum trihydrate or silicon dioxide filler, it offers a number of advantages. Such a material allows removal of air bubbles during manufacture and thus avoids cracks and voids during the decades of expected service. The resin prevents stress from corona and partial discharge (internal corona). Such stresses would produce breakdown in other material such as plastics. The resin permits short spacing of electrodes and good weathering in a salt atmosphere.

The timer 122 is set to the 8 to 100 milisecond pulse bursts based on the time needed to acquire the necessary information over the pulse period, and is set to the 10 second to 10 minute interval between bursts on the basis of the time required for the capacitor 142 to accumulate the energy needed to activate the laser 110. Intervals as long as ten minutes are permissible because the signal conditioning equipment 118 need not reset the switch system 66 very often. One preferred interval time is four minutes. One preferred pulse burst time is 50 miliseconds.

Figure 4:
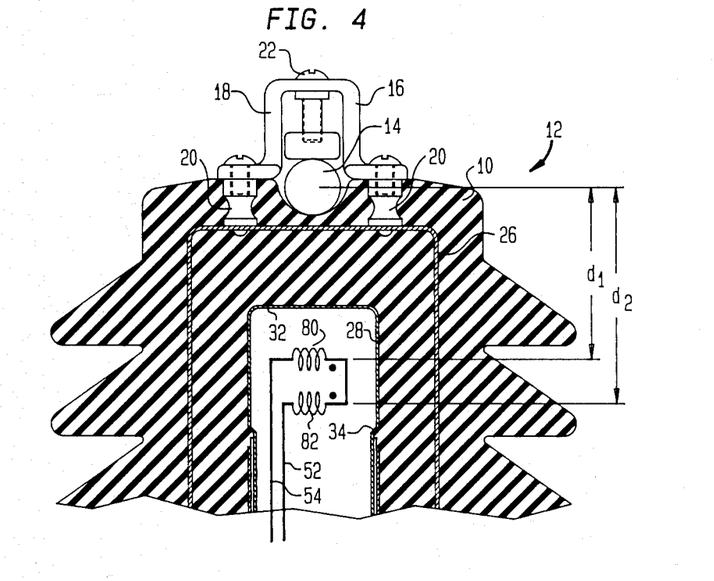
FIG. 4 is a schematic view of another embodiment of the invention.

The invention may be applied to other embodiments of the coupler 12. For example it may be applied to the other embodiments disclosed in the aforementioned application Ser. No. 776,910 filed Sep. 17, 1985. In such other embodiments, the coil 48 of FIGS. 1 and 2 is replaced by two coils 80 and 82, spaced radially of the line 14 and connected in substractive relation as shown in FIG. 4. Both coils 80 and 82 are wound along axes transverse to the line 14, along the magnetic flux path to sense the varying magnetic field formed by the current through the line 14. The closer of the coils to line 14, i.e., 80, produces an output greater than that of the coil 82 at the lines 52 and 54. The latter produces a value that is proportional to the difference. The structive suppresses noise from other lines, i.e., phase of the system, or from other sources. Yet the output at line 52 and 54 is still representative of the current in the line 14.

This can best be understood by considering that voltage components v1 and v2 at the coils 80 and 82 arising from current in the line 14 are substantially different because the distances d1 and d2 to the line 14 are substantially different. On the other hand, the noise signals n1 and n2 arising from a distant source, such as the line current of another phase spaced far from both coils 80 and 82, are almost the same; i.e., $n1=n2$. Hence the voltage across coil 80 is $v1+n1$ and the voltage across the coil 82 is $v2+n2$. The total output VT at lines 52 and 53 is now $v1+n1-(v2+n2)=v1+n1=v1-n2$. Thus $VT=v1=v2$. This effectively suppresses the noise n1 and n2.

Figure 5:
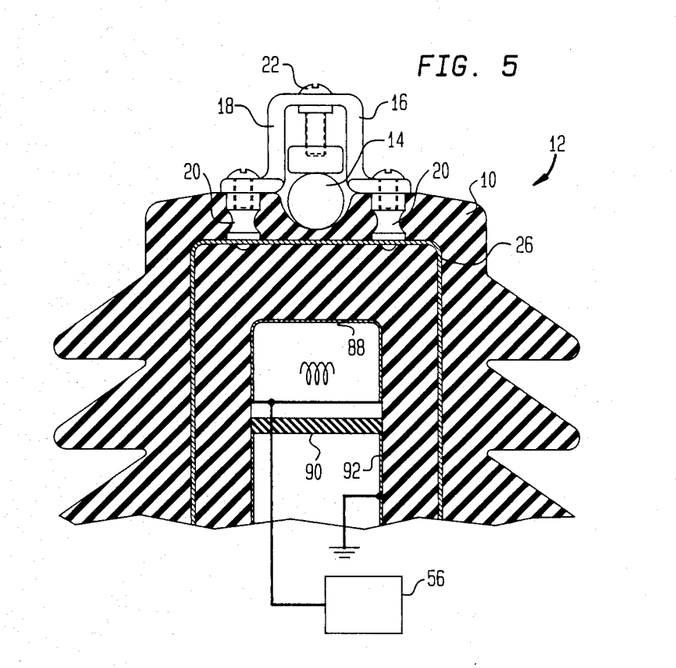
FIG. 5 is a somewhat schematic view of yet another embodiment.

FIG. 5 shows another embodiment of the invention in somewhat schematic form. There the insulator 10 is again connected to the screen electrode 26. However, an electrode 88, corresponding to the electrode 28, extends only somewhat beyond the coil 48 (or the coils 80 and 82). An insulator 90 of the type described separates the electrode 88 from another cylindrical ground electrode 92 corresponding to the electrode 38. Here again the electrode 26 forms a capacitor with the electrode 88, and the latter forms a capacitor with the electrode 92.

These embodiments overcome inaccurate readings that could result from the presence of rain or contaminants. Rain or contaminants alter the equipotential distribution that is normally highly non-uniform with equipotential lines crowded at the top and bottom of the insulator 10. The grounding electrodes 38 and 92 prevent the long electrode 28 from being affected by the rain-induced equipotential redistribution, and the short electrode 88 from being affected by stress concentration in the insulation material.

Figure 6:
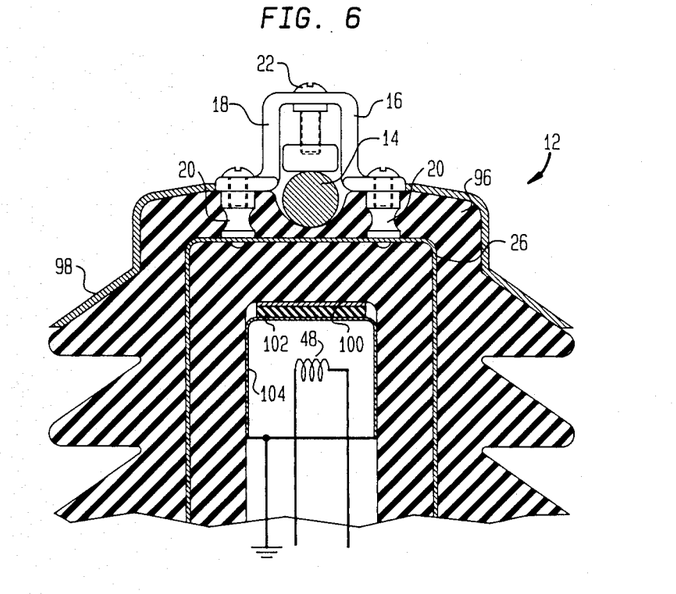
FIG. 6 is a sectional view of another embodiment.

Another embodiment of the device 12 is shown in FIG. 6. Here a porcelain insulator 96 is covered by an external semiconductor glaze 98 in common use to reduce radio interference problems. A thin metal disc 100 of aluminum or copper is placed on top of an insulator 102 and deals with the problem of rain or contaminants. A metal cup 104 of aluminum or copper under the insulator encloses the coil 48 (or coils 80 and 82) and is grounded. The short top electrode prevents voltage stresses at the bottom of the cup.

Figure 7:
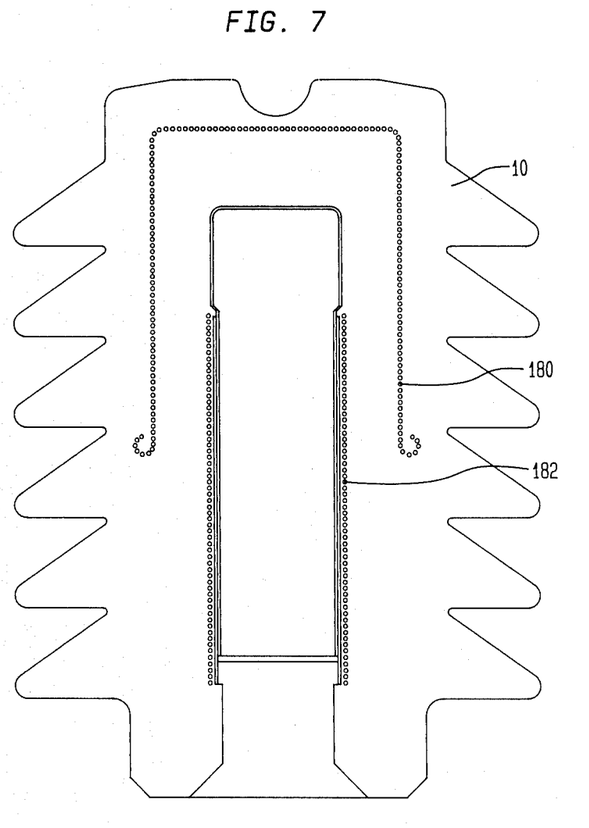
FIG. 7 is a sectional view of another embodiment.

FIG. 7 illustrates yet another embodiment wherein electrodes 180 and 182 corresponding to respective electrodes 26 and 38 are composed of metal screen or metal fiber material embedded in the insulator and are shown as small circles.

The fiber-optic link, composed of the laser 110 and the fiber 112, together with the timer 122 which times the laser to transmit short powerful burst between longer delays, isolates the conditioning equipment 118 from the transmission line ground and protects it from lightning strokes and other transients.

The system of the invention acquires the power needed to transmit burst of laser signals over short periods by accumulating small amounts of energy a period which may be as long as ten minutes. This period is adequate for the purpose of electric utilities because they are concerned with long-term conditions such as thermal time constants in the equipment being used. At present many utility companies conduct local surveys for correcting phase manually every three or four weeks.

Sample value for some of the components are as follows:

Zener diode 132: 100 volts
Transformer 136: 10:1 step down
Capcitor 142: 1000 microfarads
Resistor 109 and 111: 50 ohms each While embodiments of the invention have been described in detail, it will be evident that the invention may be practiced otherwise without departing from its spirit and scope.

What is claimed is:

1. A power transmission system, comprising:
   a power transmission line;
   a sensor coupled to said line for sensing operating conditions of said line;
   said sensor including voltage forming means capacitively coupled to said line;
   an optical fiber system responsive to said sensor for transmitting optical signals representing the operating conditions of said line;
   control means responsive to said optical fiber system and coupled to said line for controlling the operating conditions of said line;
   signal actuating means responsive to said voltage forming means for accumulating energy over a period of time and actuating said optical fiber system to transmit the optical signals for a length of time less than the period of time during which energy is accumulated.

2. A system as in claim 1, wherein the length of time over which the optical signals are transmitted is less than 1% of the period of time over which energy is accumulated.

3. A system as in claim 2, wherein the period of time during which said signal actuating means accumulates energy is ten seconds to ten minutes.

4. A system as in claim 1, wherein the said conditions said sensor senses are voltage and current and wherein said optical fiber system responds to the voltage and current sensed by said sensor for forming the optical signals representing the operating conditions of the line.

5. A system as in claim 2, wherein the conditions said sensor senses are voltage and current and wherein said optical fiber system responds to the voltage and current sensed by said sensor for forming the optical signals representing the operating conditions of the line.

6. A system as in claim 3, wherein said sensor senses voltage and current and wherein said optical fiber system responds to the voltage and current sensed by said sensor for forming the optical signals representing the operating conditions of the line.

7. A system as in claim 1, wherein said signal actuating means includes:
   a power supply responsive to said voltage forming means;
   a capacitor coupled to said power supply for accumulating energy; and
   a timer for establishing the period of time during which energy is accumulated and the length of time during which optical signals are transmitted.

8. A system as in claim 2, wherein said signal actuating means includes:
   a power supply responsive to said voltage forming means;
   a capacitor coupled to said power supply for accumulating energy; and
   a timer for establishing the period of time during which energy is accumulated and the length of time during which optical signals are transmitted.

9. A system as in claim 3, wherein said signal actuating means includes:
   a power supply responsive to said voltage forming means;
   a capacitor coupled to said power supply for accumulating energy; and
   a timer for establishing the period of time during which energy is accumulated and the length of time during which optical signals are transmitted.

10. A system as in claim 4, wherein said signal actuating means includes:
    a power supply responsive to said voltage forming means;
    a capacitor coupled to said power supply for accumulating energy; and
    a timer for establishing the period of time during which energy is accumulated and the length of time during which optical signals are transmitted.

11. A system as in claim 5, wherein said signal actuating means includes:
    a power supply responsive to said voltage forming means;
    a capacitor coupled to said power supply for accumulating energy; and
    a timer for establishing the period of time during which energy is accumulated and the length of time during which optical signals are transmitted.

12. A system as in claim 6, wherein said signal actuating means includes:
    a power supply responsive to said voltage forming means;
    a capacitor coupled to said power supply for accumulating energy; and
    a timer for establishing the period of time during which energy is accumulated and the length of time during which optical signals are transmitted.

13. A system as in claim 4, wherein said signal actuating means includes:
    a power supply responsive to said voltage forming means;
    a capacitor for accumulating energy from said power supply; and
    a timer for establishing the period of time during which energy is accumulated and for establishing the length of time during which the optical signals are transmitted; and
    wherein said optical fiber system includes:
    signal processing means responsive to the voltage and current sensed by said sensor for producing signals representing operating conditions of said line including voltage and current, and having a first analog to digital converter for converting analog voltage values to digital voltage values, a second analog to digital converter for converting analog current values to digital current values, a time division multiplexer responsive to said digital values, and transducer means for converting the output of said time division multiplexer to the optical signals;
    said signal processing means being responsive to said timer for transmitting said optical signal at times established by said timer.

14. A device as in claim 5, wherein said signal actuating means includes:

a power supply responsive to said voltage forming means;

a capacitor for accumulating energy from said power supply; and a timer for establishing the period of time during which energy is accumulated and for establishing the length of time during which the optical signals are transmitted; and wherein said optical fiber system includes:

signal processing means responsive to the voltage and current sensed by said sensor for producing signals representing operating conditions of said line including voltage and current, and having a first analog to digital converter for converting analog voltage values to digital voltage values, a second analog to digital converter for converting analog current values to digital current values, a time division multiplexer responsive to the digital values, and transducer means for converting the output of said time division multiplexer to the optical signals;

said signal processing means being responsive to said timer for transmitting said optical signal at times established by said timer.

15. A device as in claim 6, wherein said signal actuating means includes:

a power supply responsive to said voltage forming means;

a capacitor for accumulating energy from said power supply; and a timer for establishing the period of time during which energy is accumulated and for establishing the length of time during which the optical signals are transmitted; and wherein said optical fiber system includes:

signal processing means responsive to the voltage and current sensed by said sensor for producing signals representing operating conditions of said line including voltage and current, and having a first analog to digital converter for converting analog voltage values to digital voltage values, a second analog to digital converter for converting analog current values to digital current values, a time division multiplexer responsive to said digital values, and transducer means for converting the output of said time division multiplexer to the optical signals;

said signal processing means being responsive to said timer for transmitting said optical signal at times established by said timer.

16. A control system for a power transmission line, comprising:

a sensor coupled to said line for sensing operating conditions of said line;

said sensor including voltage forming means capacitively coupled to said line;

an optical fiber system responsive to said sensor for transmitting optical signals representing the operating conditions of said line;

control means responsive to said optical fiber system for controlling the operating conditions of said line;

signal actuating means responsive to said voltage forming means for accumulating energy over a period of time and actuating said optical fiber system to transmit the optical signals for a length of time less than the period of time during which energy is accumulated.

17. A system as in claim 16, wherein the length of time over which the optical signals are transmitted is less than 1% of the period time over which energy is accumulated.

18. A system as in claim 17, wherein the period of time during which said signal actuating means accumulates energy is ten seconds to ten minutes.

19. A system as in claim 16, wherein the operating conditions said sensor senses are voltage and current and wherein said optical fiber system responds to the voltage and current sensed by said sensor for forming the optical signals representing the operating conditions of the line.

20. A system as in claim 17, wherein said signal actuating means includes:

a power supply responsive to said voltage forming means;

a capacitor coupled to said power supply for accumulating energy; and a timer for establishing the period of time during which energy is accumulated and the length of time during which optical signals are transmitted.

21. A system as in claim 18, wherein said signal actuating means includes:

a power supply responsive to said voltage forming means;

a capacitor coupled to said power supply for accumulating energy; and a timer for establishing the period of time during which energy is accumulated and the length of time during which optical signals are transmitted.

22. A system as in claim 17, wherein said signal actuating means includes:

a power supply responsive to said voltage forming means;

a capacitor for accumulating energy from said power supply; and a timer for establishing the period of time which energy is accumulated and for establishing the length of time during which the optical signals are transmitted; and wherein said optical fiber system includes:

signal processing means responsive to the voltage and current sensed by said sensor for producing signals representing operating conditions of said line including voltage and current, and having a first analog to digital converter for converting analog voltage values to digital voltage values, a second analog to digital converter for converting analog current values to digital current values, a time division multiplexer responsive to said digital values, and transducer means for converting the output of said time division multiplexer to the optical signals;

said signal processing means being responsive to said timer for tramsmitting said optical signal at times established by said timer.

23. A system as in claim 18, wherein said signal actuating means includes:

a power supply responsive to said voltage forming means;

a capacitor for accumulating energy from said power supply; and a timer for establishing the period of time during which energy is accumulated and for establishing the length of time during which the optical signals are transmitted; and wherein said optical fiber system includes:

signal processing means responsive to the voltage and current sensed by said sensor for producing signals representing operating conditions of said line including voltage and current, and having a first analog to digital converter for converting analog voltage values to digital voltage values, a second analog to digital converter for converting analog current values to digital current values, a time division multiplexer responsive to said digital values, and transducer means for converting the output of said time division multiplexer to the optical signals;

said signal processing means being responsive to said timer for transmitting said optical signal at times established by said timer.

24. A system as in claim 19, wherein said signal actuating means includes:
a power supply responsive to said voltage forming means;
a capacitor for accumulating energy from said power supply; and
a timer for establishing the period of time during which energy is accumulated and for establishing the length of time during which the optical signals are transmitted; and wherein said optical fiber system includes:
signal processing means responsive to the voltage and current sensed by said sensor for producing signals representing operating conditions of said line including voltage and current, and having a first analog to digital converter for converting analog voltage values to digital voltage values, a second analog to digital converter for converting analog current values to digital current values, a time division multiplexer responsive to said digital values, and transducer means for converting the output of said time division multiplexer to the optical signals;

said signal processing means being responsive to said timer for transmitting said optical signal at times established by said timer.

25. A transmission system measuring arrangement, comprising:
a sensor coupled to said line for sensing operating conditions of said line;
said sensor including voltage forming means capacitively coupled to said line;
an optical fiber system responsive to said sensor for transmitting optical signals representing the operating conditions of said line;
signal actuating means responsive to said voltage forming means for accumulating energy over a period of time and actuating said optical fiber system to transmit the optical signals for a length of time less than the period of time during which energy is accumulated.

26. A system as in claim 25, wherein the length of time over which the optical signals are transmitted is less than 1% of the period time over which energy is accumulated.

27. A system as in claim 26, wherein the period of time during which said signal actuating means accumulates energy is ten seconds to ten minutes.

28. A system as in claim 25, wherein said sensor senses voltage and current and wherein said optical fiber system responds to the voltage and current sensed by said sensor for forming the optical signals representing the operating conditions of the line.

29. A system as in claim 25, wherein said signal actuating means includes:
a power supply responsive to said voltage forming means;
a capacitor coupled to said power supply for accumulating energy; and
a timer for establishing the period of time during which energy is accumulated and the length of time during which optical signals are transmitted.

30. A system as in claim 26, wherein said signal actuating means includes:
a power supply responsive to said voltage forming means;
a capacitor coupled to said power supply for accumulating energy; and
a timer for establishing the period of time during which energy is accumulated and the length of time during which optical signals are transmitted.

31. A system as in claim 27, wherein said signal actuating means includes:
a power supply responsive to said voltage forming means;
a capacitor coupled to said power supply for accumulating energy; and
a timer for establishing the period of time during which energy is accumulated and the length of time during which optical signals are transmitted.

32. A system as in claim 28, wherein said signal actuating means includes:
a power supply responsive to said voltage forming means;
a capacitor coupled to said power supply for accumulating energy; and
a timer for establishing the period of time during which energy is accumulated and the length during which optical signals are transmitted.

33. A system as in claim 28, wherein said signal actuating means includes:
a power supply responsive to said voltage forming means;
a capacitor for accumulating energy from said power supply; and
a timer for establishing the period of time during which energy is accumulated and for establishing the length of time during which the optical signals are transmitted; and wherein said optical fiber system includes:
signal processing means responsive to the voltage and current from said sensor for producing signals representing operating conditions of said line including voltage and current, and having a first analog to digital converter for converting analog voltage values to digital voltage values, a second analog to digital converter for converting analog current values to digital current values, a time division multiplexer responsive to said digital values, and transducer means for converting the output of said time division multiplexer to said optical signals;

said signal processor being responsive to said timer for transmitting said optical signal at times established by said timer.

34. A system as in claim 29, wherein said signal actuating means includes:
a power supply responsive to said voltage forming means;
a capacitor for accumulating energy from said power supply; and a timer for establishing the period of time during which energy is accumulated and for establishing the length of time during which the optical signals are transmitted; and wherein said optical fiber system includes:

signal processing means responsive to the voltage in current from said sensor for producing signals representing operating conditions of said line including voltage and current, and having a first analog to digital converter for converting analog voltage values to digital voltage values, a second analog to digital converter for converting analog current values to digital current values, a time division multiplexer responsive to said digital values, and transducer means for converting the output of said time division multiplexer to the optical signals;

said signal processor being responsive to said timer for transmitting said optical signal at times established by said timer.

35. A system as in claim 30, wherein said signal actuating means includes:

a power supply responsive to said voltage forming means;

a capacitor for accumulating energy from said power supply; and a timer for establishing the period of time during which energy is accumulated and for establishing the length of time during which the optical signals are transmitted; and wherein said optical fiber system includes:

signal processing means responsive to the voltage and current from said sensor for producing signals representing operating conditions of said including voltage and current, and having a first analog to digital converter for converting analog voltage values to digital voltage values, a second analog to digital converter for converting analog current values to digital current values, a time division multiplexer responsive to said digital values, and transducer means for converting the output of said time division multiplexer to the optical signals;

said signal processor being responsive to said timer for transmitting said optical signal at times established by said timer.

36. A system as in claim 31, wherein said signal actuating means includes:

a power supply responsive to said voltage forming means;

a capacitor for accumulating energy from said power supply; and a timer for establishing the period of time during which energy is accumulated and for establishing the length of time during which the optical signals are transmitted; and wherein said optical fiber system includes:

signal processing means responsive to the voltage and current from said sensor for producing signals representing operating conditions of said line including voltage and current, and having a first analog to digital converter for converting analog voltage values to digital voltage values, a second analog to digital converter for converting analog current values to digital current values, a time division multiplexer responsive to said digital values, and transducer means for converting the output of said time division multiplexer to the optical signals;

said signal processor being responsive to said timer for transmitting said optical signal at times established by said timer.

37. A system as in claim 32, wherein said signal actuating means includes:

a power supply responsive to said voltage forming means;

a capacitor for accumulating energy from said power supply; and a timer for establishing the period of time during which energy is accumulated and for establishing the length of time during which the optical signals are transmitted; and wherein said optical fiber system includes:

signal processing means responsive to the voltage and current from said sensor for producing signals representing operating conditions of said line including voltage and current, and having a first analog to digital converter for converting analog voltage values to digital voltage values, a second analog to digital converter for converting analog current values to digital current values, a time division multiplexer responsive to said digital values, and transducer means for converting the output of said time division multiplexer to the optical signals;

said signal processor being responsive to said timer for transmitting said optical signal at times established by said timer.

* * * * *